(12) United States Patent
Jensen et al.

(10) Patent No.: US 10,777,393 B2
(45) Date of Patent: Sep. 15, 2020

(54) PROCESS CONDITION SENSING DEVICE AND METHOD FOR PLASMA CHAMBER

(71) Applicant: KLA-Tencor Corporation, Milpitas, CA (US)

(72) Inventors: Earl Jensen, Santa Clara, CA (US); Mei Sun, Los Altos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 169 days.

(21) Appl. No.: 15/851,184

(22) Filed: Dec. 21, 2017

(65) Prior Publication Data

US 2018/0114681 A1 Apr. 26, 2018

Related U.S. Application Data

(62) Division of application No. 14/505,289, filed on Oct. 2, 2014, now abandoned, which is a division of
(Continued)

(51) Int. Cl.
*H01J 37/32* (2006.01)
*H01L 21/67* (2006.01)
(Continued)

(52) U.S. Cl.
CPC .... *H01J 37/32954* (2013.01); *G01R 19/0061* (2013.01); *H01J 37/32* (2013.01);
(Continued)

(58) Field of Classification Search
CPC ........... H01J 37/32954; H01J 37/32935; H01J 37/32917; H01J 37/32; H01L 22/34; H01L 21/67253; H01L 21/67069; G01R 19/0061
See application file for complete search history.

(56) References Cited

U.S. PATENT DOCUMENTS 5,444,259 A 8/1995 Ohmi
5,801,386 A * 9/1998 Todorov ............ H01J 37/32935
250/397
(Continued)

FOREIGN PATENT DOCUMENTS

CN 1380811 A 11/2002
CN 1452230 A 10/2003
(Continued)

OTHER PUBLICATIONS

Chinese Office Action for CN Application No. 201180006694.4, dated Jun. 9, 2014.
(Continued)

*Primary Examiner* — Yuechuan Yu
(74) *Attorney, Agent, or Firm* — JDI Patent; Joshua D. Isenberg; Robert Pullman

(57) ABSTRACT

A sensing device for measuring a plasma process parameter in a plasma chamber for processing workpieces may include a substrate with one or more sensor embedded in the substrate. The substrate can have a surface made of substantially the same material as workpieces that are plasma processed in the plasma chamber. Each sensor can include a collector portion made of substantially the same material as the substrate surface. The collector portion includes a surface that is level with the surface of the substrate. The collector portion is the top surface of the substrate. Sensor electronics are embedded into the substrate and coupled to the collector portion. When the substrate surface is exposed to a plasma one or more signals resulting from the plasma can be measured with the sensor(s).

13 Claims, 5 Drawing Sheets

Related U.S. Application Data application No. 12/691,695, filed on Jan. 21, 2010, now Pat. No. 8,889,021.

(51) Int. Cl.
 *G01R 19/00* (2006.01)
 *H01L 21/66* (2006.01)

(52) U.S. Cl.
 CPC .. *H01J 37/32917* (2013.01); *H01J 37/32935* (2013.01); *H01L 21/67069* (2013.01); *H01L 21/67253* (2013.01); *H01L 22/34* (2013.01)

(56) References Cited

U.S. PATENT DOCUMENTS

| | | | |
|---|---|---|---|
| 6,326,794 B1 | 12/2001 | Lundquist et al. | |
| 6,691,068 B1 | 2/2004 | Freed et al. | |
| 6,830,650 B2 | 12/2004 | Roche et al. | |
| 6,902,646 B2 | 6/2005 | Mahoney et al. | |
| 7,192,505 B2 | 3/2007 | Roche et al. | |
| 7,555,948 B2 | 7/2009 | Wiese et al. | |
| 7,742,782 B2 | 6/2010 | Kim et al. | |
| 8,889,021 B2 | 11/2014 | Jensen et al. | |
| 2002/0170875 A1* | 11/2002 | Benzel | B81C 1/00047 216/2 |
| 2003/0197175 A1 | 10/2003 | Huang et al. | |
| 2004/0007326 A1* | 1/2004 | Roche | H01J 37/32935 156/345.24 |
| 2004/0028837 A1 | 2/2004 | Fink | |
| 2004/0102064 A1 | 5/2004 | Mathieu | |
| 2004/0225462 A1* | 11/2004 | Renken | H01L 21/67253 702/94 |
| 2005/0151544 A1 | 7/2005 | Mahoney et al. | |
| 2005/0194094 A1 | 9/2005 | Yasaka | |
| 2006/0043063 A1 | 3/2006 | Mahoney et al. | |
| 2006/0171848 A1 | 8/2006 | Roche et al. | |
| 2006/0249729 A1 | 11/2006 | Mundt et al. | |
| 2007/0251339 A1* | 11/2007 | Wiese | H01L 22/22 73/866.1 |
| 2008/0038926 A1* | 2/2008 | Ventzek | H01J 37/32027 438/706 |
| 2009/0044752 A1 | 2/2009 | Furuya | |
| 2011/0174777 A1 | 7/2011 | Jensen et al. | |

FOREIGN PATENT DOCUMENTS

| | | |
|---|---|---|
| CN | 1479887 A | 3/2004 |
| CN | 1647252 A | 7/2005 |
| CN | 101320675 A | 12/2008 |
| JP | 05094898 A | 4/1993 |
| JP | 2004507889 A | 3/2004 |
| JP | 2007502519 A | 2/2007 |
| JP | 2009535855 A | 10/2009 |
| KR | 1020040108751 A | 12/2004 |
| KR | 1020080107261 A | 12/2008 |
| TW | 200506388 | 2/2005 |
| TW | I256278 | 6/2006 |
| TW | 200949965 A | 12/2009 |
| WO | 0217030 A3 | 2/2002 |
| WO | 2002017030 B1 | 3/2003 |
| WO | 2005017937 A2 | 2/2005 |
| WO | 2004051713 A3 | 3/2005 |

OTHER PUBLICATIONS

European Search Report and Written Opinion for EP Application No. 11735001.7, dated Apr. 2, 2015.
Final Office Action for U.S. Appl. No. 12/691,695, dated Jul. 31, 2012.
International Search Report and Written Opinion for International Application No. PCT/US2011/020872, dated Aug. 23, 2011.
Japanese Office Action for JP Application No. 2012-550028, dated Jun. 14, 2016.
Japanese Office Action for JP Application No. 2012-550028, dated Dec. 2, 2014.
Korean Office Action for KR Application No. 10-2012-7018009, dated Nov. 21, 2016.
Non-Final Office Action for U.S. Appl. No. 12/691,695, dated Feb. 26, 2014.
Non-Final Office Action for U.S. Appl. No. 12/691,695, dated Mar. 28, 2012.
Non-Final Office Action for U.S. Appl. No. 14/505,289, dated Dec. 23, 2016.
Notice of Allowance for U.S. Appl. No. 12/691,695, dated Jul. 16, 2014.
Office Action for TW Application No. 099140860, dated Jul. 13, 2017.
Taiwanese Office Action for TW Application No. 099140860, dated Apr. 14, 2016.
Taiwanese Office Action for TW Application No. 099140860, dated Nov. 3, 2015.
Final Office Action for U.S. Appl. No. 14/505,289, dated Jun. 8, 2017.
Non-final Office Action for U.S. Appl. No. 14/505,289, dated Sep. 27, 2017.

* cited by examiner

PROCESS CONDITION SENSING DEVICE AND METHOD FOR PLASMA CHAMBER

CLAIM OF PRIORITY

This Application is a divisional of commonly-assigned U.S. patent application Ser. No. 14/505,289, filed Oct. 2, 2014, the entire contents of which are incorporated herein by reference.

Application Ser. No. 14/505,289 is a divisional of commonly-assigned U.S. patent application Ser. No. 12/691,695, filed Jan. 21, 2010, the entire contents of which are incorporated herein by reference.

FIELD OF THE INVENTION

This invention relates generally to plasma processing systems, and more particularly to apparatus for making in-situ measurements of plasma properties in plasma processing systems.

BACKGROUND OF THE INVENTION

Plasma processes are frequently used to modify or treat the surfaces of workpieces such as semiconductor wafers, flat-panel display substrates, and lithography masks. Conditions within a plasma process are designed to produce a complex mixture of ions, reactive chemical species (free radicals), and energetic neutral species. The interaction of these materials then produces the desired effect on the surfaces of workpieces. For example, plasma processes are used to etch materials from the surfaces of semiconductor wafers so as to form complex electrical elements and circuits. The conditions within the plasma process are carefully controlled to produce the desired etch directionality and selectivity.

The surface modifications produced by a specific plasma are sensitive to a number of basic parameters within the plasma. These parameters include such variables as: chemical concentrations (partial pressures), temperatures (both surface and gas phase), and electrical parameters (ion fluxes, ion energy distribution functions). A number of these parameters (e.g. gas concentrations and pressure) can generally be easily controlled using external actuators such as Mass Flow Controllers (MFCs) and servo driven throttle valves. Other important parameters (e.g. temperatures and free radical concentrations) can often be observed or measured via sensor systems (e.g. thermocouples and Optical Emission Spectrometers (OES)) installed on the process tool. A last set of important parameters such as ion fluxes and ion energies are more difficult to either directly control or monitor.

US publication No. 2005-0151544 discloses a plasma processing system with diagnostic apparatus for making in-situ measurements of plasma properties. The diagnostic apparatus generally comprises a non-invasive sensor array disposed within a plasma processing chamber, an electrical circuit for stimulating the sensors, and means for recording and communicating sensor measurements for monitoring or control of the plasma process. In one form, the sensors are dynamically pulsed dual floating Langmuir probes that measure I-V characteristic, displacement RF current into or through the wafer and self-bias due to electrons piling up on the surface, which can be used to determined the charge on the wafer.

Wafer charges are formed due to different flux rates for ions and electrons (due to their very different masses). Wafer charging can lead to damage to the devices. One type of tool that is conventionally used for characterizing wafer charging during wafer processing in ion-based and plasma-based IC processing equipment includes EEPROM-based peak potential sensors and current sensors to characterize the I-V relationship of charging transients. The gate of the transistors is coupled to the antenna structures on the wafer. The device measures the cumulative charge, not charge as a function of time. Furthermore, the wafer has to be taken out of the plasma chamber to read the charge measurement.

US publication No. 2006-0249729 discloses a sensor wafer that uses a triple capacitor stack to measure apparent alternating current (AC) at the surface of the wafer. This rectification (detection) device has a minimum bias requirement and a strong frequency dependency on the range of interest. The measurement is purely AC and the center capacitor, formed by a polyimide substrate is the shunt impedance that generates the AC potential to be measured. The sensor responds in a confounded way to a number of electrical parameters in the plasma chamber and is unable to relate specifically to any one parameter. This makes it difficult to find the right "knobs" to tune the chamber when problems are encountered.

In addition, many prior art sensor wafers include a module atop of the wafer that houses electronics for the sensor array. This module can cause severe disturbance in the plasma or can be a point of discharge damages and can also be a source for contamination.

Another problem with prior art sensor wafers is that sensor pads in the array and electrical connections between these pads and associated electronics are often made of metal traces, e.g., Aluminum, that is deposited on the surface of the wafer. Exposure to plasma, e.g., Argon plasma, eventually erodes aluminum traces on the surface of the wafer. In some sensor wafers, entire surface of the wafer is covered by polyimide to protect the traces and sensor pads. However, the polyimide coating can have a very short life time in certain plasma environments and may also be a source of contamination. In addition, the use of certain metals, such as copper, is strongly avoided in many process steps.

It is within this context that embodiments of the present invention arise.

BRIEF DESCRIPTION OF THE DRAWINGS

Objects and advantages of embodiments of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to one embodiment of the present invention, a plasma sensing device may include sensors and electronics, embedded in the surface of a wafer substrate and directly visible to the plasma sheath. The surface of the wafer substrate and portion of the sensing device that is exposed to the plasma can both be made of a material that is conventionally processed by the type of plasma that the device is designed to sense. By way of example, in some embodiments, a shunt impedance for one or more of the sensors can be formed by a "slug" of material that is substantially the same as the material the wafer substrate and that is also directly visible to the plasma sheath. As used herein, the term "substantially the same material" means that the one material is chemically similar if not physically identical to another material. For example, the substrate and slug materials can be substantially the same if the wafer substrate and slug are both made of single crystal silicon but with different crystalline orientations. Alternatively, the substrate and slug materials can be substantially the same if the substrate is made of single crystal silicon and the slug is made of polycrystalline silicon. The term "substantially the same" also encompasses slight variations in the chemical composition the two materials, e.g., due to different but otherwise acceptable levels of impurities.

Forming the shunt impedance in this manner provides a durable and non contaminating surface for the plasma and can also provide a DC connection to the surface of the substrate. Hence, surface DC potential may be measured. This structure can give valuable information such as surface charge, self-bias, load-line characteristics or I-V characteristics is a DC bias is simultaneously imposed upon the sensor.

Figure 1:
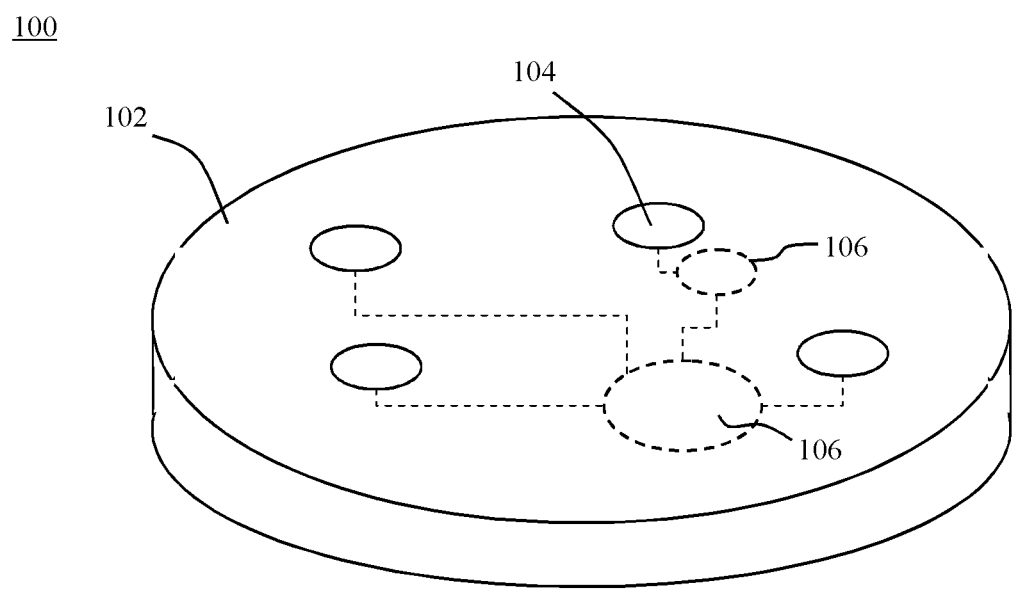
FIG. 1 is a perspective view schematic diagram illustrating a wafer having plugs for sensing devices according to an embodiment of the present invention.

FIG. 1 is a perspective view of a sensing device 100 that includes a substrate 102 several slugs 104 as collectors for sensors. The substrate 102 and slugs 104 can be made of the same material. By way of example, and not by way of limitation, the substrate 102 and slugs 104 can both be made of silicon, or any other conductive or semiconductor material that is compatible with the processing conditions in the processing environment in which the device 100 is intended to operate. By way of example, and not by way of limitation, the substrate may include a silicon wafer with a diameter of between 100 mm and 450 mm. The sensing device 100 may have an overall thickness of 0.3 mm to 10 mm The substrate 102 and slugs 104 can provide a durable and non contaminating surface presented to the plasma. For example, if the plasma diagnosed by the sensing device is conventionally used for processing, e.g., etching of or deposition on silicon wafers, the substrate and a collector pad that is part of a sensor may be made of silicon so that the plasma "sees" a silicon surface. In some implementations, if it is desired to present a dielectric surface to the plasma, a plasma-compatible polymer coating, such as photoresist, can cover the surface of the wafer substrate. Many plasma process chambers are designed to process substrates that are covered with photoresist. Consequently, the presence of photoresist on the surface of the substrate 102 and slugs 104 poses no additional contamination hazard beyond those already taken into account in the design of the plasma process diagnosed by the device 100 and the chamber in which such a plasma process takes place. Contamination of a plasma chamber resulting from exposure of the surface of the substrate 102 and slugs 104 to the plasma may be rectified by whatever conventional process is used following normal treatment of production substrates in the chamber. For example, after using the device 100 to diagnose a plasma in a chamber used to etch a silicon substrate covered with a patterned photoresist, the chamber may be cleaned by a conventional process normally used to clean such a chamber after such plasma etching.

The slugs 104 may be electrically coupled to sensor electronics 106 located beneath the surface of the substrate 102. There may be more than one sensor electronics 106 below the surface of the substrate 102 for the purpose of processing the sensor signals. By way of example, the slugs may serve as collector pads for sensing a flux of electrons or ions or energetic radiation from a plasma. In some implementations, the substrate 102 and slugs 104 may provide a DC connection from sensor electronics to the surface. Such a configuration can be used measure surface DC potential. Such a structure can also be used to obtain valuable information such as surface charge and self-bias. In some implementations, AC signal detection may be performed by a temperature compensated, DC biased high-frequency, diode bridge circuit. This method can eliminate the disadvantages of poor linearity and low power levels, frequency effects as well as temperature drift associated with prior art methods.

In some embodiments, the electronics 106 may apply an excitation voltage at one sensor slug 104 and measure a signal at one or more different slugs to measure the plasma impedance.

Figure 2A:
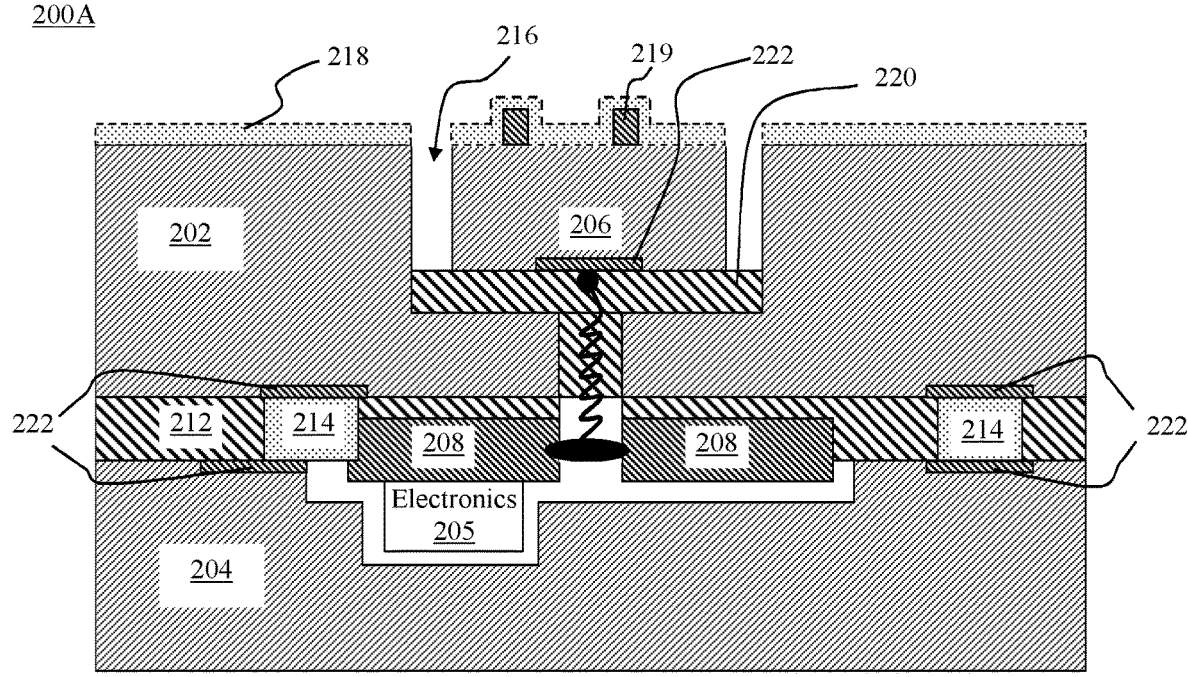
FIG. 2A is a cross-sectional view of a sensing device according to an embodiment of the present invention.
Figure 2B:
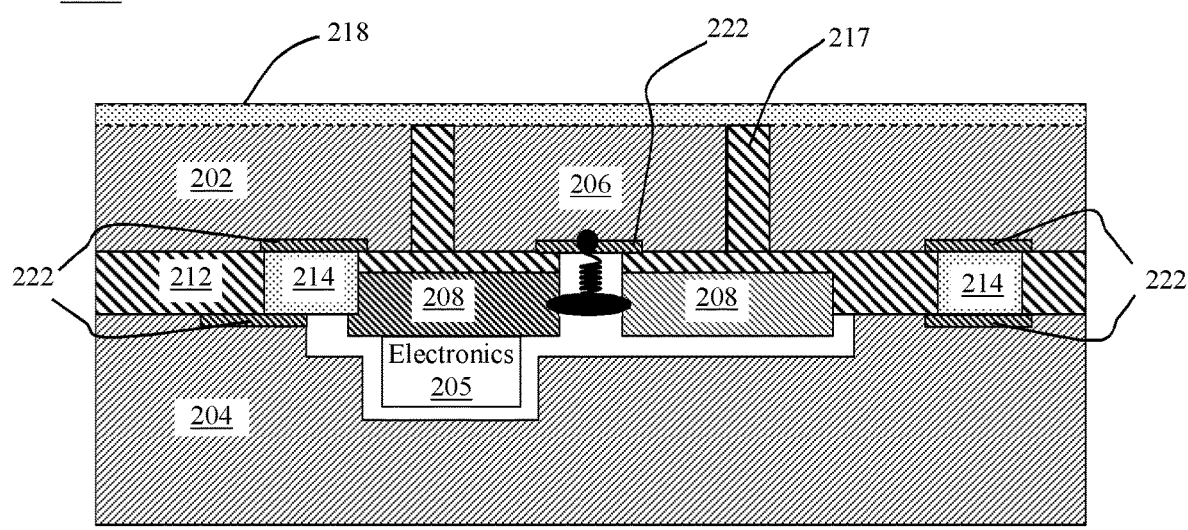
FIG. 2B is a cross-sectional view of a sensing device according to an alternative embodiment of the present invention.

According to some embodiments of the present invention, active circuitry and a power-source may be embedded into and/or in-between layers of a device like that shown in FIG. 1, thereby effectively forming a Faraday cage around such components. By way of example, and not by way of limitation, FIGS. 2A-2B are cross-sectional views illustrating different implementations of sensing devices 200A and 200B. By way of example, and not by way of limitation, the sensing devices 200A and 200B can be used to measure electrical parameters such as self bias voltage, saturation current, charge and polymer build up in process chamber with process chemistry and under high plasma power over a wide range of RF and Microwave frequencies.

As shown in FIG. 2A, the sensing device 200A includes a first and second layers 202 and 204 respectively separated by an insulating layer 212, which can be an oxide or other dielectric layer. The first layer 202 can be made from the same material as a production wafer that is normally processed by the type of plasma the device 200A is designed to sense. In the device 200A a cavity 216 can be formed at the surface of the first layer 202. A plug made of the same material as the first layer 202 sensor can be positioned in the cavity 216 with the top surface of the plug 206 coplanar with the top surface of the first layer 202. The underside of the plug 206 can have a metallic coating 222 that is suitable for making an ohmic contact connection. By way of example, the metallic coating can be diffused into the silicon and thus does not create a diode junction to the silicon. Examples of suitable materials for the metallic coating 222 include platinum and palladium. If wire bonding is performed, aluminum can also be used. Therefore, the top surface of the device 200 can be made planar and have a profile substantially the same as that of a standard production substrate processed in the type of chamber that the device 200A is designed for. A dielectric layer 220 (e.g., polyimide) can be deposited between the silicon plug 206 and the first layer 202 to provide electrical isolation. The dielectric layer 220 can also form a shunt capacitance that can be used to measure an RF current which may be impinging on the sensor surface formed by plug 206.

The plug 206 can be exposed to plasma and act as a signal collector by collecting a raw flux, e.g., charge (in the form of electrons or ions), from the plasma that can be detected as a raw signal, e.g., in the form of a current or voltage. Alternatively, the plug 206 may be subject to radiation from the plasma in the form of energetic photons. To detect such photons, the plug 206 may be made of a semiconductor material having electrical properties that change upon exposure to such photons. The plug 206 can be coupled to suitable sensor electronics 205. The combination of a signal collector, such as the plug 206, and sensor electronics 205 is sometimes referred to herein as a sensor. Depending on the nature of the electronics, the sensor may be used to detect AC or DC signals.

Examples of suitable sensor electronics 205 include signal conditioning electronics and signal processing electronics. In addition, the electronics may include a power source, such as a battery, which may be used to apply a bias voltage to the plug 206. As used herein, signal conditioning includes, but is not limited to, filtering, noise rejection, or amplification of the raw signal to make it more suitable for analysis. Examples of signal conditioning components include, but are not limited to, rectifiers, oscillators, or amplifiers. Signal processing refers to analysis of a signal, e.g., using analog or digital circuitry. Signal processing may include, but is not limited to, analog-to-digital conversion, arithmetic and/or logical operations, Fourier transforms or other mathematical transforms, spectral analysis, and the like. Examples of signal processing components include, but are not limited to a microprocessor or an application-specific integrated circuit (ASIC). By way of example, and not by way of limitation, the electronics 205 could include data acquisition (DAQ) electronics that produce a DC signal that is coupled to processing electronics.

The plug 206 may be electrically connected to the electronics 205, e.g., by circuitry, which may be embedded in the second silicon layer 204 or in the insulating layer 212, e.g., in the form of a flex circuit 208. In such a case, the components (e.g., transistors, resistors, capacitors, logic devices, etc, that make up the electronics 205 can be connected by conductive (e.g., copper) traces patterned onto a polyimide flexible substrate. Alternatively the electronic components that make up the sensor electronics 205 and associated circuits may be formed directly on the surface of the second layer 204 or the insulating layer 212, e.g., using standard semiconductor processing techniques. The electronics 205 may be electrically connected to the first layer 202 e.g., by an ohmic contact 214 coupled to the flex circuit 208. An ohmic contact 214 may also be formed between the first layer 202 and the second layer 204. The ohmic contact 214 can provide an electrical connection to the substrate 204 and 206, e.g., by means of a suitable metallization 222 as described above. Furthermore, the ohmic contact 214, may be expanded to essentially create a contact that would cover most of the available surface area of silicon layers 202 and 204.

It is noted that multiple slugs 206 may be used to provide multiple collectors that may be coupled to appropriate sensor electronics. The collectors and sensor electronics may be configured in many different ways to measure plasma parameters. For example, with appropriate electronics and additional circuits, pairs of collectors and corresponding sensor electronics may be configured to operate as dual differential Langmuir probes. In such a configuration, the sensor electronics can apply a bias voltage between two collectors and measure currents to the two collectors. By varying the bias voltage, ion saturation current and electron temperature may be determined from an I-V curve. Furthermore, by simplification of the control circuitry, triple differential Langmuir probe operation is possible or a differential Langmuir probe operated in a time division configuration.

A triple differential probe with appropriate circuitry can provide a response with minimal processing. In a triple probe configuration, two collectors may be biased positive and negative with a fixed voltage $(V_+-V_-)$ between them while a voltage on a third collector is allowed to float to the plasma floating potential $V_B$. If the bias voltage is sufficiently large compared to the electron temperature (i.e., $e(V_+-V_-)>>k_B T_e$, where e is the charge on the electron and $k_B$ is Boltzmann's constant) the negative biased collector can be expected to draw the ion saturation current, which, like the floating potential $V_{fl}$, can be directly measured. If the biased collector configuration is floating, the current to the positive-biased collector is approximately equal in magnitude to the ion saturation current drawn by the negative-biased collector and the floating collector can be expected to effectively draw no current.

Under these conditions the electron temperature is approximately proportional to the measured voltages as follows:

$$(V_+-V_{fl})=\ln 2(k_B T_e/e).$$

More sophisticated analysis of triple probe data can take into account such factors as incomplete saturation, non-saturation, unequal areas. Triple probes also can be symmetrically, asymmetrically or highly asymmetrically depending on the region the probe is expected to operate under. Triple probes have the advantage of simple biasing electronics (no sweeping of the bias voltage is required), simple data analysis, excellent time resolution, and insensitivity to potential fluctuations (whether imposed by an RF source or inherent fluctuations). The disadvantage is that they require three probe areas which may not be possible to implement in all cases.

Alternatively, by time division multiplexing, four bias voltage conditions may be set and used to derive an electron temperature $T_e$ and ion density $n_i$ with a dual Langmuir probe. The Ion Saturation current, $I_{sat}$, may also be similarly estimated. The result is very similar to the triple probe but using only two probe areas.

Sensing device 200B shown in FIG. 2B is similar to the sensing device 200 described in FIG. 2A, except that the silicon plug 206 is positioned on the insulating layer 212 like the first layer 202. By way of example, and not by way of limitation, the plug may be formed from a silicon-on-insulator (SOI) wafer in which the insulator is disposed between two layers of silicon. By selectively etching one of the two silicon layers the plug 206 may be electrically separated from a remaining portion of that layer. The plug may be further insulated from the silicon layer by additional insulating material 217. By forming the plug 206 from the same initial material as the first layer 202 the surface of the plug 206 can be made almost perfectly flush with the surface of the rest of the first layer 202. Furthermore, the first layer 202 and the plug 206 can be assured to have almost identical material properties.

It is noted that in the devices 200A and 200B, the first layer 202 and second layer 204 may be made sufficiently electrically conducting (e.g., by suitable doping) so that they form a Faraday cage that is suitable for protecting the electronics 204 from electromagnetic interference during operation within a Plasma procession environment.

Figure 2C:
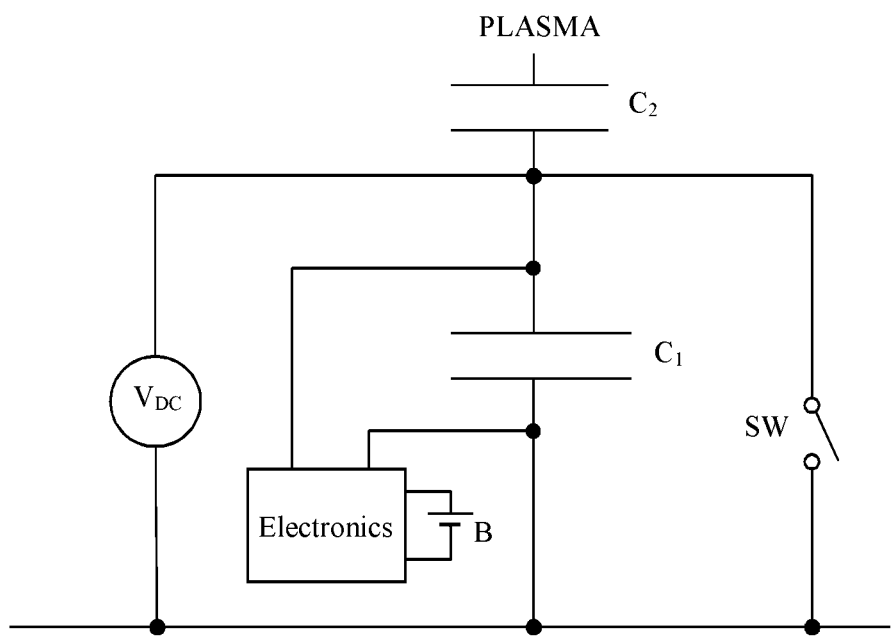
FIG. 2C is an equivalent electrical diagram of the sensing devices shown in FIGS. 2A-2B.

FIG. 2C is an electrical schematic diagram of an equivalent circuit of the sensing devices illustrated in FIGS. 2A-2B. As indicated in FIGS. 2A-2B, a polymer layer 218 may build up on the surface of the first layer 202 as a result of a polymerization reaction that takes place in the plasma chamber. Such polymerization is a fairly common occurrence in many types of plasma processing. The polymerization layer 218 can affect the measurements made with the devices 200A, 200B.

In some embodiments, the surface of a collector portion, e.g., plug 206 can be modified, e.g., by etching a three-dimensional pattern into the surface or by deliberately coating it with one or more materials 219 such as a photo-resist and/or metal to modify the interaction between the collector and a plasma. By way of example, and not by way of limitation, the material 219 can be deposited or otherwise formed in pattern, e.g., a grid or series of stripes. The material 219 can be different from the material that makes up the bulk of the plug 206.

Specifically, as shown in FIG. 2C, the polymer layer 218 can act as a variable capacitor $C_1$. Referring simultaneously to FIG. 2A and FIG. 2C, a measuring capacitor $C_2$ may be formed in series with the variable capacitor $C_1$ due to the polymer layer with the silicon plug 206 as the upper plate and the electronics, first and second silicon layers 202 and 204 and the ohmic contacts 214 forming the lower plate of the capacitor. The polyimide layer 220 can act as an insulating material between two plates of the measuring capacitor $C_2$. The capacitor $C_2$ can be connected to a power source, e.g., a battery, B. If a switch SW is added across the plates of the measuring capacitor $C_2$, a rate of the electron built up on the surface of the substrate could be measured by shorting the plates of the measuring capacitor $C_2$ by closing the switch and then measuring the voltage change when the switch is opened.

Figure 3:
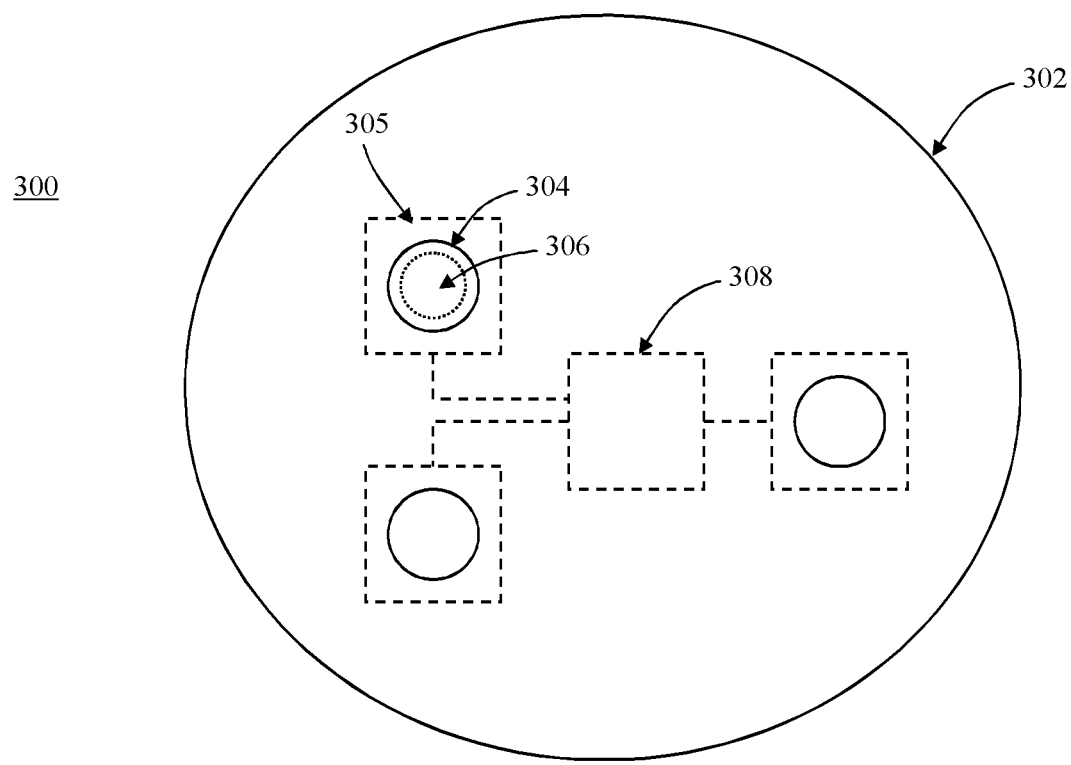
FIG. 3 is a top view of a sensing device according to an embodiment of the present invention.

FIG. 3 is a top view of a sensing device 300 according to an embodiment of the present invention. As shown in FIG. 3, the sensing device 300 includes a substrate 302 with several sensors 304, which may be similar to the sensing devices 200 and 201 as described in FIGS. 2A-2B. Specifically, each sensor 304 may include a collector 306 that is formed from the same material as the surface of the substrate 302. A surface of the collector may be flush with the surface of the substrate 302. The collector 306 may be coupled through sensor 304 to local sensor electronics 305 which may be embedded into the substrate 302. The collector 306 may include such features as patterned film-stacks, micro-machined surface features or simply a metal film such as a layer of aluminum. In addition, the sensing device 300 may include a centralized processing and/or communication electronics unit 308 that is coupled to each of the sensors 304 and collector 306 if any. The centralized electronics 308 can provide centralized component for transmitting and storing data from the sensors 304 out of device 300 to a remote receiver. The electronics can also provide a centralized component for receiving data from an external transmitter and relaying such data to one or more selected individual sensors 304. The electronics 300 may include a wireless or wired transceiver unit that converts the data into signals that can be transmitted wirelessly, e.g., by electromagnetic induction or radiation. Alternatively, the electronics 308 may transmit the signals over a medium, such as a signal cable or fiber optic link.

Examples of suitable sensor electronics 305 include signal conditioning electronics and signal processing electronics. In addition, the electronics may include a power source, such as a battery, which may be used to apply a bias voltage to the sensor 304 and collector 306. As noted above, signal conditioning includes, but is not limited to, filtering, noise rejection, or amplification of the raw signal to make it more suitable for analysis. Examples of signal conditioning components include, but are not limited to, rectifiers, oscillators, or amplifiers. Signal processing refers to analysis of a signal, e.g., using analog or digital circuitry. Signal processing may include, but is not limited to, analog-to-digital conversion, arithmetic and/or logical operations, Fourier transforms or other mathematical transforms, spectral analysis, and the like. Examples of signal processing components include, but are not limited to a microprocessor or an application-specific integrated circuit (ASIC).

By way of example, and not by way of limitation, the electronics 305 could include a localized processor unit that is specific to the sensor 304 with which it is associated. By using a localized processor unit at each sensor 304, part of the burden of processing the raw signals from the sensor 304 and collectors 306 may be distributed. In this way, the processing burden may be made to scale with the number of sensors on the device 300 without having to add processing capacity to the centralized electronics 308. For example, in addition to rectification, amplification, and A/D conversion the sensor electronics 305 could perform certain digital signal filtering functions on the raw data and then transmit the resulting filtered data to the centralized electronics. This frees up processing resources on the centralized electronics for collating the filtered data from the different sensors 304.

It is noted that embodiments of the present invention encompass many different configurations in which a sensor device may include a collector may be formed from the same material as a production substrate. These embodiments include versions in which the collector pad comprises an entire continuous surface of the sensor device. By way of example, and not by way of limitation, a single continuous surface of silicon substrate may be used as a collector pad. By measuring voltage differences between different locations on the surface of the substrate it is possible to determine differences in surface charge buildup.

Figure 4A:
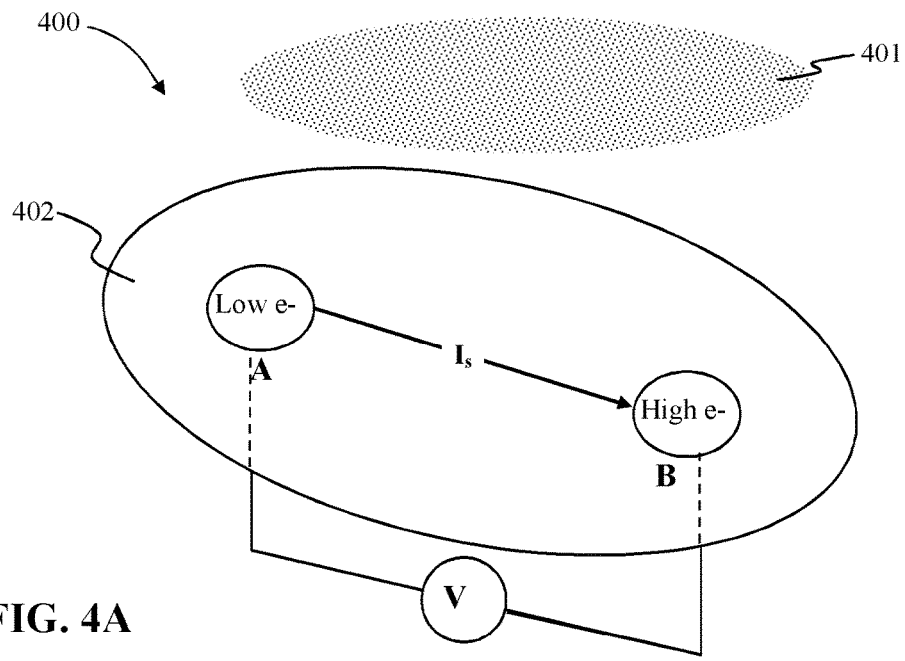
FIG. 4A is a perspective view illustrating measurement of current across the surface of a plasma measurement device according to an embodiment of the present invention.

FIG. 4A is a schematic perspective view illustrating a plasma sensing device 400 according to an alternative embodiment of the invention. In the device 400, a collector, is made from a substrate 402 that is made of resistive material that the same as or similar to the material used in production substrates that are subject to plasma 401 in a process chamber. The substrate 402 may have a planar top surface that has substantially the same profile as a production substrate that is processed in the process chamber. If charge builds up non-uniformly on the surface of the substrate 401, a sheet current $I_s$ may flow across the surface of the substrate 401. As shown in FIG. 4A, a voltage may be measured between different locations A and B on the surface of the substrate 401. If the substrate material has a sufficiently large sheet resistance, the sheet current $I_s$ can be used as measure of the charge imbalance across the substrate surface. Specifically, the voltage between points A and B may be determined from the current, which depends on sheet resistivity of the substrate material 401 and the charge imbalance between the two points.

Figure 4B:
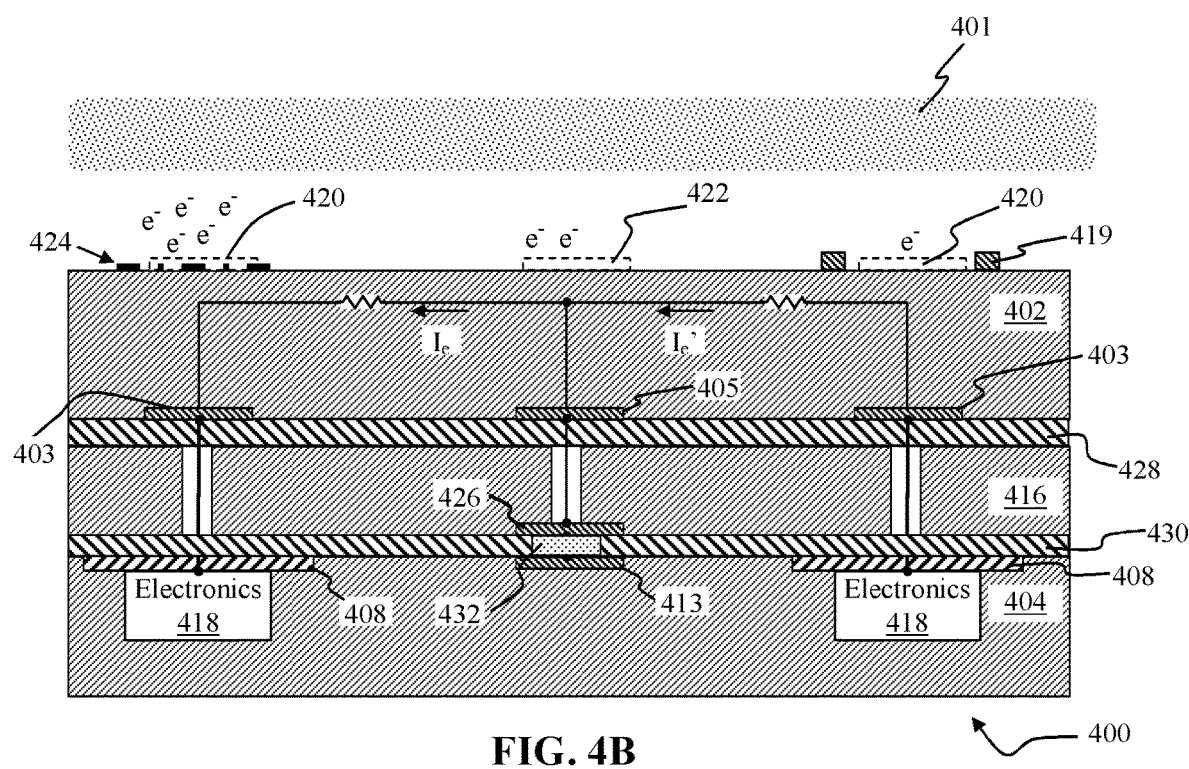
FIG. 4B is a combined cross-section and electrical schematic diagram of an equivalent circuit of the device shown in FIG. 4A.

FIG. 4B is a combination equivalent electrical circuit schematic diagram and cross-sectional view of the sensing device 400. The sensing device 400 generally includes an upper semiconductor substrate 402 and a lower semiconductor substrate 404. In some embodiments, an intermediate semiconductor substrate 416 may be sandwiched between the upper and lower substrates. For convenience the substrates 402, 404, 416 are sometimes referred to below simply as the upper, middle, and lower substrates. By way of example, upper substrate 402 may be a first silicon layer 402 doped P− to make it resistive, and the bottom substrate 404 may be a second silicon layer doped P+ to make it conductive. An insulating layer 428 is sandwiched between the upper and lower substrates 402 and 404. In the example shown in FIG. 4B, the insulating layer is more specifically sandwiched between the upper substrate 402 and the intermediate substrate 416. The insulating layer 428 may be relatively, thick, e.g., 25 microns or more in thickness. There are a number of ways to form the insulating layer 428. For example, oxide may be implanted into a silicon wafer. Alternatively, oxide may be grown on the surface of a silicon wafer and polycrystalline silicon (polysilicon) may be grown or deposited on the oxide. In addition, a polymer layer may be laminated between two silicon wafers.

Similarly, an insulating layer 430 may be formed between substrates 404 and 416.

Suitable electronics 418 may be positioned in cavities formed in the lower substrate 404. Each electronics unit may be electrically coupled to a corresponding sensor contact 403, by a corresponding pattered metallization or a pattered flexible circuit 408 formed on, or inlaid into, the lower substrate 404. The electronics can be configured to measure direct current (DC) or alternating current (AC) electrical quantities such as voltage, current, charge, capacitance, and the like at the sensor locations 403. Also the electronics 418 may excite one or more sensor contacts 403 and/or a reference contact 405 with DC levels or AC waveforms and simultaneously measure AC and DC parameters at other sensor contact locations 403 and/or reference contact 405 to determine various plasma parameters. By way of example, the electronics 418 may apply an excitation voltage at one sensor contact 403 and measure a signal at one or more different sensor contacts and/or the reference contact 405 to measure the plasma impedance. Alternatively, the excitation voltage may be applied to the reference contact 405 and signals may be measured at the sensor contacts 403.

As seen in FIG. 4B the collector portions of the sensors can be embedded in a substrate by forming them as integral parts of the upper semiconductor layer 402. By way of example one or more sensor contacts can be formed by depositing a suitable conductive material such as platinum, palladium or aluminum in the areas of the sensor contacts 403 and reference contact 405, in locations on an underside of the upper semiconductor layer 402 where a sensor is desired. The can be diffused into the upper semiconductor layer 402 thus creating a ohmic connection. Since the vertical dimension of the upper semiconductor layer 402 is much smaller that the horizontal dimension, the effect is that the metallic sensor contacts 403 at the bottom of the upper layer 402 is mirrored onto the top surface as a virtual sensor 420. In a like manner the effect of the central reference contact 405 is mirrored as a virtual sensor 422. Any voltage present at the top surface would be translated to the bottom surface and there for can be sensed and driven by appropriate electronics 418. The reference contact 405 at a center position may be connected to the middle substrate 416 via a electronic switch in the electronics module 418. Such ohmic contact to substrate 416 can effectively provide for a DC reference potential of the middle and lower substrates 416 and 404. This DC reference can be important, e.g., when measuring DC voltages with the electronics 418, but can be turned of when measuring AC voltages.

In some embodiments, one or more portions of the surface of one or more collector portions, e.g., selected portions of the upper surface of the upper layer 402 can be modified, e.g., by etching a three-dimensional pattern into the surface or by deliberately coating them with a material 419 such as a photoresist and/or metal to modify the interaction between the collector and a plasma. The material 419 can be deposited or otherwise formed in pattern, e.g., a grid or series of stripes. The material can be different from the material that makes up the bulk of the upper layer 402.

Figure 4C:
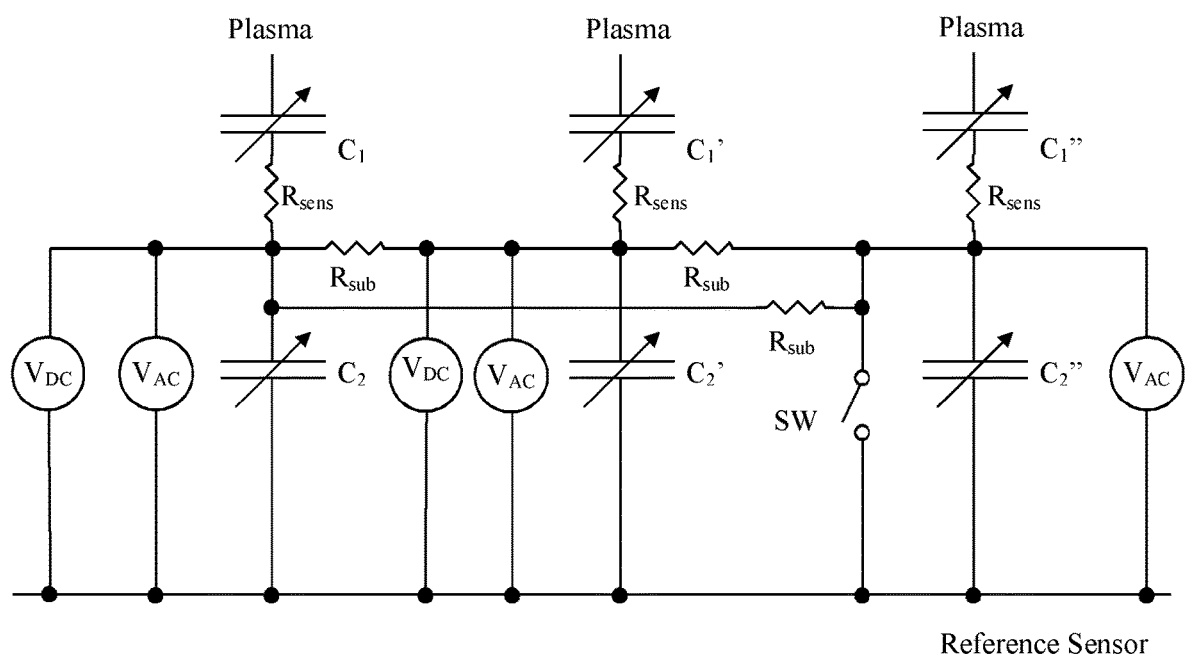
FIG. 4C is an equivalent electrical circuit diagram of the device shown in FIG. 4B.

The electronics 418 can sense sheet currents $I_e$ flowing through the upper substrate 402 between the sensor contacts 403 and a reference contact 405 at a center location thereby providing a measure of the self-bias and charge build-up on the surface of the upper layer 402. Voltage differences can be measured due to the sheet resistance of upper layer 402 and the sheet currents $I_e$ flowing between different sensor contacts 403 and/or between the sensor contacts 403 and the reference contact 405. In FIG. 4C, the sheet resistance of the substrate is represented by resistors designated $R_{sub}$. By placing several such sensor contacts at different locations within the device 400 and sensing the sheet currents between the image 422 of the central reference contact 405 and each images 420 of the sensor contacts 403 the charge imbalance over the surface of the upper silicon layer 402 can be measured in real time. The voltage or charge measurements can be converted to digital data and stored at a central electronics unit (not shown) for later transmission to an external receiver without having to remove the device 400 from the plasma chamber.

The middle and lower substrates 416 and 404 may also act as a Faraday cage for shielding of the electronics 418 and the associated metallization 408. By way of example, the middle substrate 416 and the lower 404 can be ohmically connected to each other through contacts 426, and 413, which may be in the form of metallization regions created in a manner similar to that described above, and/or the ohmic contact 432. Furthermore, the upper substrate 402 together with insulating layer 428 and base substrate 416 can act as a distributed capacitor. This capacitance can serve as a test load to sense an RF current by the RF voltage generated at each sensing point. The amplitudes of such voltages may be rectified and measured by the electronics 418. Schematically, the local part of the distributed capacitance is equivalent to the capacitor C2 shown in FIG. 2C. The equivalent capacitances between the sensor contacts 403 are indicated as C and C' in FIG. 4C. The equivalent capacitance between the reference contact 405 and the plasma is indicated as C" in FIG. 4C. The DC part of the signal, as measured by the electronics 418, at the sensor contact 403, is related to the charge distribution. The sensor contact 403 and reference contact 405 may also be excited by an applied AC or DC voltage for measurement of parameters such as ion saturation current, electron temperature and plasma impedance.

As in the embodiments shown in FIGS. 2A and 2B, a collector area 424 constructed with pattered film stacks can be placed upon the first surface of substrate 402 to modify the electrical response of the substrate 402 to the plasma.

Embodiments of the present invention provide a tool for measurement of ion and electron characteristics of a plasma and, optionally, for measurement of surface charging in a wafer production system. The ability to measure these quantities in a wafer production system can provide additional insight to plasma processing surface parameters. Also surface related topology may radically alter the behavior of the sensing locations and this phenomenon may be taken advantage of to measure such parameters such as polymer re-deposition, ion angles and charge damage with higher sensitivity and a wider dynamic range. Embodiments of the present invention can help more easily identify key elements that affect plasma chamber performance and subsequently adjust the relevant parameter to optimize performance.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A sensing device for measuring plasma process parameters in a plasma chamber for processing workpieces, the sensing device comprising:
a substrate having a first layer made of a material that is substantially the same material as workpieces that are processed by a plasma in the plasma chamber;
one or more sensors embedded in the substrate, wherein each sensor comprises a collector portion made from a portion of the first layer that is electrically isolated from remaining portions of the first layer by an insulating material disposed between the collector portion and the remaining portions of the first layer, wherein the collector portion includes a surface that is coplanar with a top surface of the first layer; and
sensor electronics embedded into the substrate and coupled to the collector portion.

2. The sensing device of claim 1 wherein the substrate includes an electrically insulating layer sandwiched between a resistive layer that forms the collector portion and an electrically conductive layer.

3. The sensing device of claim 2 further comprising one or more electrically conductive sensor contacts formed on an underside of the resistive layer.

4. The sensing device of claim 3, wherein the electronics include DC sensor electronics electrically coupled the one or more electrically conductive sensor contacts.

5. The sensing device of claim 3, wherein the electronics include AC sensor electronics electrically coupled to the one or more electrically conductive sensor contacts.

6. The sensing device of claim 3 wherein the electronics are sandwiched between the conductive layer and another conductive layer and electrically coupled to the one or more electrically conductive sensor contacts.

7. The sensing device of claim 1 wherein a top surface of the substrate is planar and has a profile that is substantially the same as a standard process substrate.

8. The sensing device of claim 1 wherein the electronics include signal conditioning electronics and signal processing electronics.

9. The sensing device of claim 8 wherein the circuits are formed onto a polyimide flexible substrate.

10. The sensing device of claim 8 wherein the circuits are formed directly on the substrate or a layer of the substrate.

11. The sensing device of claim 1 wherein the electronics for each sensor includes a local digital processor.

12. The sensing device of claim 11 further comprising a centralized communication unit or processor coupled to each local digital processor.

13. The sensing device of claim 1 further comprising a material on the surface of the collector portion, wherein the material alters an interaction between the collector portion and the plasma.

* * * * *